Feb. 27, 1962 D. J. CROSS ET AL 3,022,674

TUNING DEVICE

Original Filed Aug. 29, 1958 4 Sheets-Sheet 1

INVENTORS
DONALD J. CROSS
WILLIAM F. SCANLON
BY Robert E. Strauss
ATTORNEY

TUNING DEVICE

Original Filed Aug. 29, 1958 4 Sheets-Sheet 2

INVENTORS
DONALD J. CROSS
WILLIAM F. SCANLON
BY Robert E. Stroemer
ATTORNEY

Feb. 27, 1962 D. J. CROSS ETAL 3,022,674

TUNING DEVICE

Original Filed Aug. 29, 1958 4 Sheets-Sheet 3

INVENTORS
DONALD J. CROSS
WILLIAM F. SCANLON
BY Robert E. Strauss
ATTORNEY

INVENTORS
DONALD J. CROSS
WILLIAM F. SCANLON
BY Robert E. Strauss
ATTORNEY

3,022,674
TUNING DEVICE

Donald J. Cross and William F. Scanlon, Tonawanda, N.Y., assignors, by mesne assignments, to Sylvania Electric Products Inc., Wilmington, Del., a corporation of Delaware Continuation of application Ser. No. 758,079, Aug. 29, 1958. This application June 8, 1960, Ser. No. 37,824
9 Claims. (Cl. 74—10.85)

This invention relates to tuning devices of the type normally employed in radio or television receivers and more particularly to tuning devices adapted to utilize preselected coarse tuning positions each provided with preselected fine tuning controls.

In certain types of electrical devices such as television receivers, the VHF channel frequencies are normally chosen by tuning the coarse tuning control to the appropriate channel position. Fine tuning for each channel may then be achieved by altering a fine tuning adjustment. In such devices, it has been the practice to provide separate customer or operator controls at an appropriate position on the receiver exterior for the coarse tuning and for each of the 12 VHF channel fine tuning adjustments. This large number of controls is increased to an even greater extent when the receiver is provided with a tuner adapted for reception of UHF frequencies. Such a control structure detracts from the styling of the receiver, it is costly to fabricate, it requires a large amount of space and it is complex and cumbersome to operate.

Accordingly, an object of the invention is to reduce the aforementioned disadvantages and to simplify operation of the tuning controls in a receiver.

A further object is to utilize one coarse tuning control and only one fine tuning control for the purpose of achieving both the coarse and fine tuning of a multiplicity of frequencies or of all VHF television channel frequencies.

The foregoing objects are achieved in one aspect of the invention by the provision of a coarse tuning control having a disc mounted thereon, a plurality of fine tuning screws rotatably mounted on the disc, and a fine tuning control having a coupling normally maintained in spaced relationship relative to the screws and mounted to allow engagement therewith upon manipulation of the fine tuning control.

For a better understanding of the invention, reference is made to the following description taken in conjunction with the accompanying drawings in which.

Figure 1:
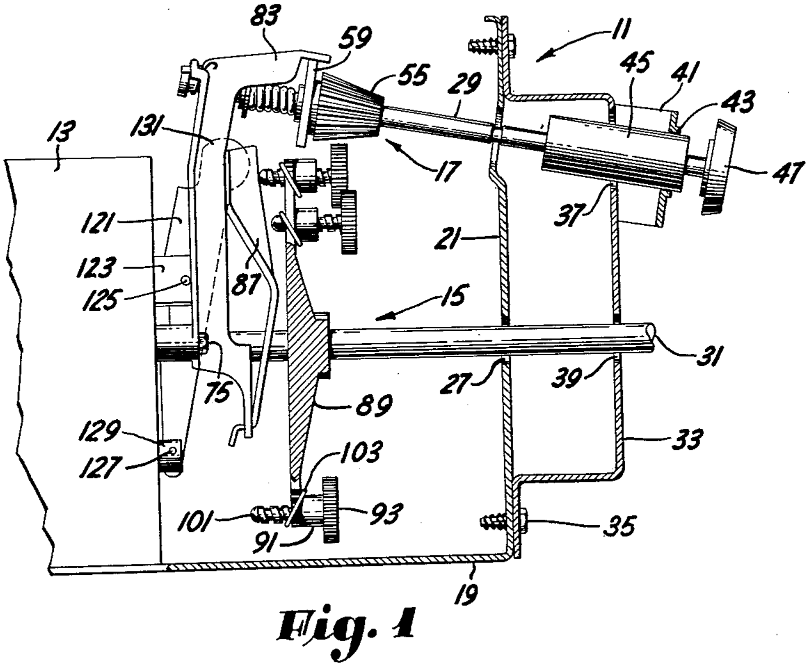
FIG. 1 is a partially sectioned plan view of coarse and fine tuning controls adapted to be employed with a VHF tuner in a television receiver.

Referring to FIG. 1, a control mechanism 11, which is adapted to be employed in a television receiver, is shown in conjunction with a VHF tuner 13 for purposes of illustration. An operator may control the coarse tuning of the receiver by rotating coarse tuning control 15 and the fine tuning of the receiver by rotating fine tuning control 17.

A housing 19 is formed to support tuner 13 and controls 15 and 17. The forward portion of the housing has a panel 21 formed with an opening 23 terminating in a channel 25 and with an aperture 27 for allowing passage of the fine tuning control shaft 29 and the coarse tuning control shaft 31 respectively therethrough. Plate 33, which is mounted upon panel 21 by screws 35, is also provided with openings 37 and 39 through which control mechanisms 15 and 17 pass. A bracket 41 is connected to the upper portion of plate 33 and is provided with mounting means or lip 43 having an inside diameter slightly larger than the diameter of sleeve or linkage 45. The fine tuning control mechanism 17 pivots about lip 43 as will be hereafter described.

Coarse tuning control 15 comprises an operator control knob (not shown) connected to shaft 31, which in turn is attached to a tuning circuit position within tuner 13. When, for example, the VHF tuner 13 is of the turret type, shaft 31 is coupled to an inductance having taps spaced along the inductance to provide preselected circuits which are resonant at the various VHF channel frequencies.

Figure 2:
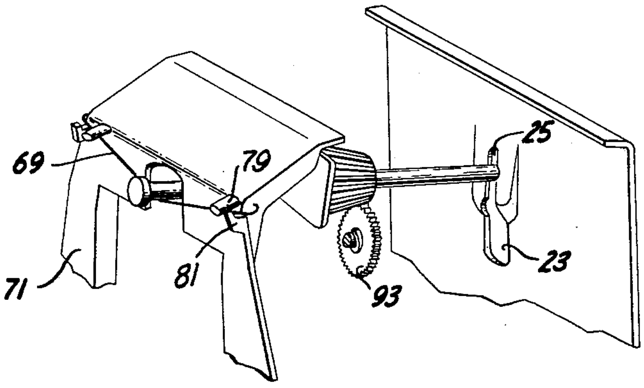
FIG. 2 is a perspective view illustrating the operation of the fine tuning control shown in FIG. 1.
Figure 3:
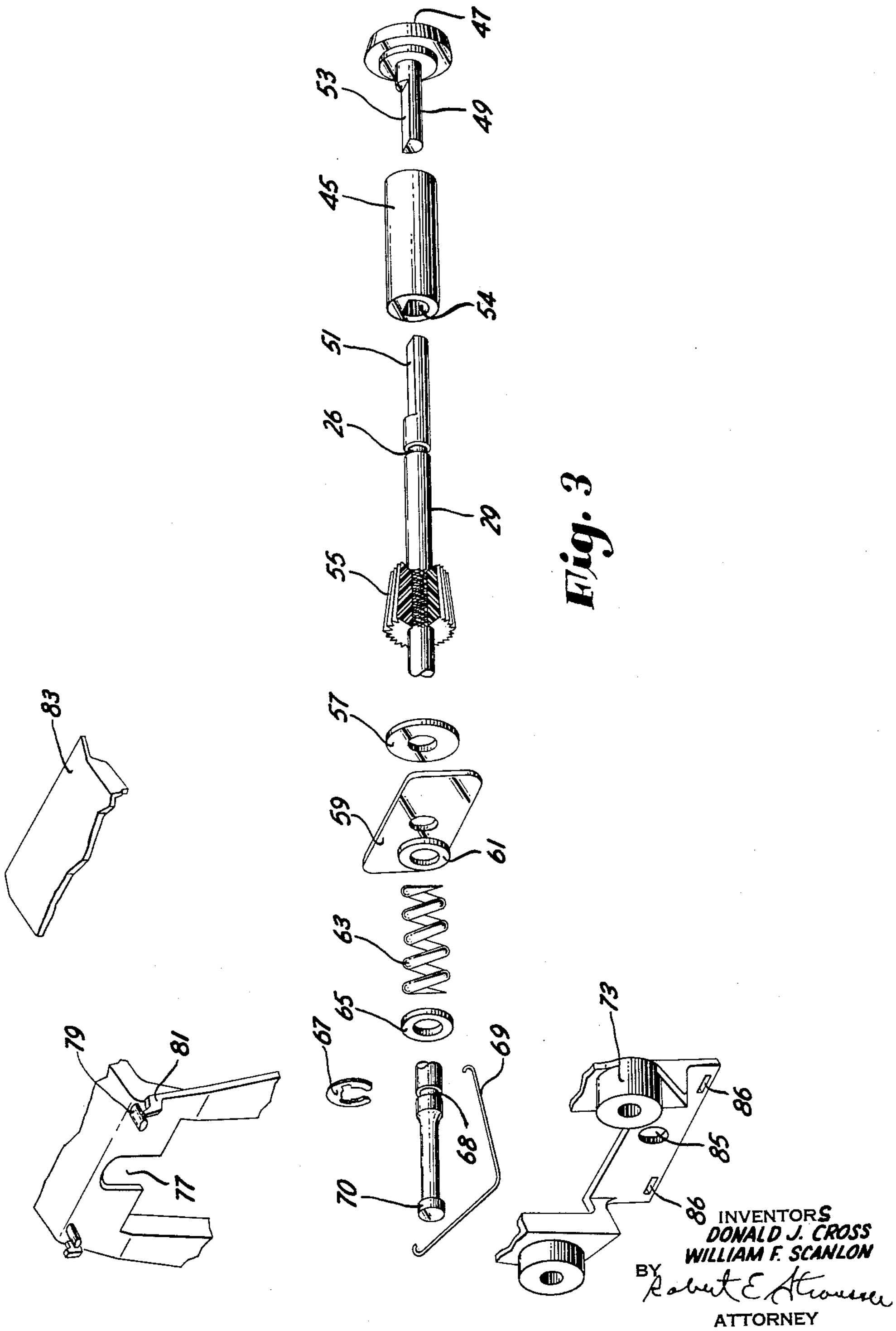
FIG. 3 is an exploded view of the mechanism shown in FIG. 2.

Referring to FIGS. 1, 2 and 3, the forward portion of fine tuning control 17 comprises a knob 47 attached to front extension shaft 49, sleeve 45 and shaft 29. The opposite ends of shafts 29 and 49 are formed to provide flats 51 and 53 respectively for slidable engagement within the opening 54 in sleeve 45.

Rigidly connected intermediate the ends of shaft 29 is a driver or beveled gear 55. The gear is followed on shaft 29 by a friction washer 57, lever means or rocker plate 59, washer 61, spring 63 and washer 65. This assemblage of components is maintained in an abutting relationship with one another by means of the pressure exerted by spring 63 and by the entrapment thereof by beveled gear 55 at one end and lock washer 67 at the other end through its engagement with recess 68. The frictional engagement of the washer 65 with lock washer 67 and the engagement of friction washer 57 with the end surface of beveled gear 55 normally causes rocker plate 59 to rotate during the rotation of shaft 29. However, as will be explained hereafter, the amount of frictional pressure is a preselected value so that shaft 29 may be rotated while rocker plate 59 is maintained in a given position without necessitating application of more than the conventional tuning rotational force which would be normally applied by an operator to knob 47.

The back end of shaft 29 is suspended from biasing means or retention spring 69 mounted upon yoke 71, which is affixed to tuner 13 by means of sleeves 73 and bolts 75. The yoke is provided with a slot 77 through which the end of shaft 29 extends, and is formed with pins 79 and fingers 81 for entrapment and mounting of retention spring 69 as shown clearly in FIG. 2. The end of shaft 29 has an enlargement 70 to prevent slippage of spring 69 from the end of the shaft. The upper portion of yoke 71 has a stop bracket 83, the lower surface of which normally abuts rocker plate 59. When the fine tuning control is rotated, the rocker plate twists against stop bracket 83 to cause driver 55 to move downwardly and in contact with tuning screw 93. The lower portion of yoke 71 is provided with an aperture 85 for allowing passage of shaft 31 and with apertures 86 formed on both sides thereof for retaining one end of pusher bar 87 as will be hereafter described.

Rigidly affixed to the coarse tuning control shaft 31 and forming part of the fine tuning control 17 is a tuner disc 89 having a plurality of sleeves 91 mounted thereon in spaced relationship upon the periphery of the disc.

Figure 4:
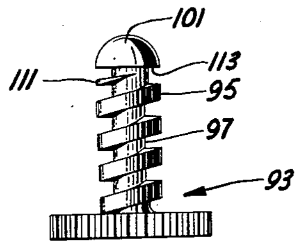
FIG. 4 is a plan view of the tuning screw adapted for use with the device shown in FIG. 1.

Each sleeve has a tuning screw 93 passing therethrough formed with top and bottom lands designated by the numerals 95 and 97 respectively, FIG. 4. The head of the tuning screw is provided with gear teeth 99 while the end is formed with cam means or a rounded edge portion 101.

Figure 5:
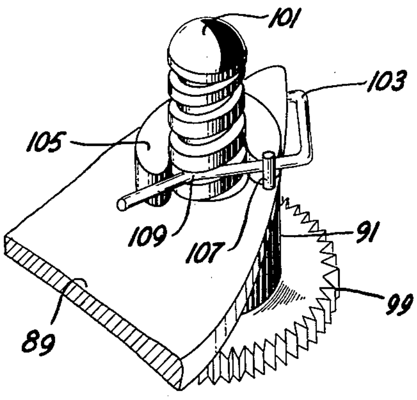
FIG. 5 is a perspective view illustrating the manner in which the screw may be mounted and manipulated to provide preset fine tuning for a television receiver.

Referring particularly to FIG. 5, tuning screw 93 may be moved in either direction longitudinally of sleeve 91 by means of the tracking effect of spring 103, which slides within the groove provided by the upper and lower lands. The spring 103 is held in position by means of its abutting relationship with retainer clip 105 and pin 107 and by virtue of its configuration whereby the spring is formed behind disc 89. Tuning screws 93 are limited in their travel in both the forward and backward longitudinal directions to prevent the screw from becoming jammed or disengaged from spring 103.

Referring to FIGS. 4 and 5, it can be seen that the walls of the screw threads are slightly tapered to allow the spring to ride out of the groove when gear head 99 is rotated to a given position inwardly. Therefore, although the crook 109 of spring 103 is normally disposed in the screw groove, when the screw is turned outwardly to the point where it would become otherwise jammed against the face of disc 89, the tapered walls of the screw grooves and the spring resiliency allows the spring to ride out of the groove and upon top land 95. With continuous rotation of the screw in the same direction, the groove will again present itself below the crook 109 in the spring to allow it to snap back into the groove. Further rotation causes the spring to repetitively ride out of and snap back into the groove. Therefore, by utilization of spring 103 in conjunction with its mounting on disc 89, the screw is limited in its forward motion without jamming, while also allowing tracking to begin as rotation is made in the opposite direction.

Referring to FIG. 4, it can be seen that the upper land 95 of screw 93 trails off to form a tail 111 which is spaced from the inside wall 113 of cam 101 by approximately the distance of the diameter of spring 103. Accordingly, when the screw is turned, for instance, in a counterclockwise direction, the spring will ride within the screw groove until it abuts wall 113. Thereafter, it can go no farther with continued rotation. Upon reversing the rotation, the tail will contact the spring and guide it so that it begins tracking in the screw groove in the opposite direction.

Figure 6:
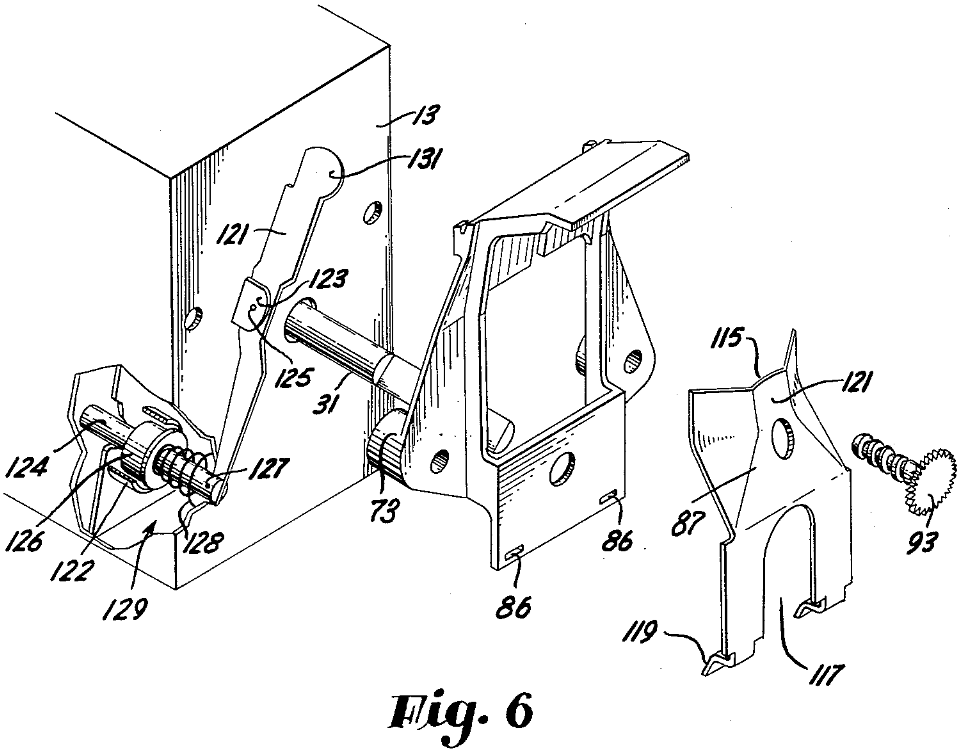
FIG. 6 is an exploded view of one portion of the tuner mechanism.

The end or cam means 101 of screw 93 is formed to operate upon pusher bar 87 to affect fine tuning of the VHF frequency with which the particular tuning screw is associated. The pusher bar, FIG. 6, is formed with a substantially V-shaped channel 115, a slot 117 for allowing passage of shaft 31 therethrough, and with links 119, which pivotally support the pusher bar upon yoke 71 by means of their engagement with the walls of apertures 86. Since slot 117 is considerably larger than the diameter of shaft 31 and since links 119 sit loosely within apertures 86, the pusher bar can pivot and move toward or away from tuner 13 under the influence of cams 101.

An arm 121 is pivotally mounted upon tuner 13 by means of tab 123 and pin 125, which serves as the pivot point for the arm. Connected to the bottom of arm 121 by pin 127 is a fine tuning device 129, which comprises a split stator capacitor 122 and a floating shaft 124 having the capacitor slug 126 mounted thereon. Device 129 is in the fine tuning circuit of each VHF channel. The slug 126 is located within the tuner by spring 128 so that the slug is continuously biased inwardly. The head 131 of arm 121 is therefore continuously pressing against the inside surface of pusher bar 87 which is in turn continuously pressing against cam surface 101 of screw 93.

In operation, the desired VHF channel is coarse tuned by rotating shaft 31 to the appropriately numbered channel. As this shaft rotates, the tuner disc also rotates, thereby presenting a fine tuning screw at the position where cam 101 abuts the outer surface 121 of pusher bar 87. Therefore, spring loaded tuning slug 126 is pulled inwardly or is forced outwardly by pivoting arm 121 as head 131 follows the movement of pusher bar 87. This bar derives its movement from the cam surface 101 of screw 93.

Assuming that all of the fine tuning screws 93 have been turned to the position where they will provide proper positioning of slug 126 and thereby proper fine tuning for the VHF channels, the rotation of coarse tuning shaft 31 also automatically provides fine tuning for the channel. Therefore, after properly locating the heads of all tuning screws 93, the fine tuning for the receiver is pre-set. During such an operation, the fine tuning control knob 47 is not manipulated and beveled gear 55 remains in spaced relationship with the tuning screw 93 which is in the top position.

When it is desired to initially adjust the fine tuning on all channels or to alter previously adjusted fine tuning for a given channel, coarse tuning shaft 31 is first rotated to the desired channel. This presents the appropriate tuning screw 93 at its position beneath beveled gear 55. Cam 101 is continuously in abutment with pusher bar 87, see FIG. 1. To achieve this fine tuning, knob 47 is rotated. At the beginning of rotation, rocker plate 59 turns about its axis to produce a torque on shaft 29 which is opposite in direction to the biasing force asserted by suspension spring 69 to cause the shaft to move downwardly and into engagement with the teeth on tuning screws 93, FIG. 8. During this movement, the fine tuning control assembly pivots about lip 43 on bracket 41. Due to the frictional mounting of the rocker plate, it slips on the shaft during continued rotation but maintains the downward pressure on the shaft. This continued rotation causes rotation of screw 93 to alter the position of pusher bar 87, pivoting arm 121 and tuning device 129 as described above.

Figure 7:
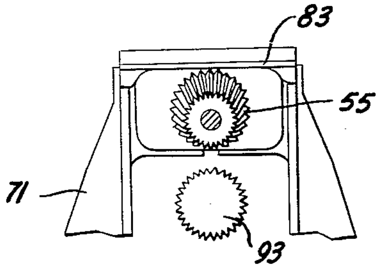
FIG. 7 illustrates the fine tuning device in a nonoperative position.
Figure 8:
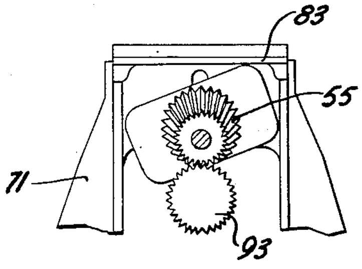
FIG. 8 illustrates the fine tuning device in an operative position.

Referring to FIGS. 7 and 8, it can be seen that rotation of knob 47 in either direction will cause one upper edge of the rocker plate to press against stop bracket 83. Since this bracket will not allow further rotation of the rocker plate, the reaction force is directed downwardly toward the tuning screw 93. Due to the loose coupling between sleeve 45 and lip 43, the control 17 is pivoted about the lip and is guided by the loose coupling between recess 23 and channel 25. After the fine tuning adjustment has been made and knob 47 has been released, suspension spring 69 forces shaft 29 upwardly so that the apparatus assumes the position shown in FIGS. 1 and 7.

A tuning device of the type described herein is adapted for use in any electrical unit employing tuners wherein it is desired to utilize both coarse and fine tuning. When applied to a television receiver, it provides a unique and simple arrangement for tuning VHF channels. If all of these channels have been properly pre-set, the single fine tuning knob need not be touched and rotation of the coarse tuning shaft 31 only is needed. When it is desired to initially set up the VHF channels or to alter the fine tuning, it is only necesary to manipulate the single knob 47 regardless of the channel since the appropriate fine tuning screw for the selected channel is automatically positioned below beveled gear 55. There is no rotation of the fine tuning screws 93 until knob 47 is turned since the suspension spring 69 holds beveled gear 55 in spaced relationship with the properly positioned tuning screw 93.

This application is a continuation of Serial No. 758,079, and now abandoned, "Tuning Device," filed August 29, 1958, by Donald J. Cross and William F. Scanlon.

Although several embodiments of the invention have been shown and described, it will be apparent to those skilled in the art that various changes and modifications may be made therein without departing from the scope of the invention as defined by the appended claims.

What is claimed is:

1. A tuning device for an electrical unit comprising adjustable cam means for altering the tuning of said unit, a rotatably mounted tuning control formed to provide a driver positioned intermediate the end portions thereof, mounting means for pivotally supporting said control at one of said end portions, biasing means for suspending said control at the opposite one of said end portions for normally maintaining said driver in spaced relationship with said adjustable cam means, and lever means frictionally mounted upon said tuning control for pivoting said control and imparting movement to said driver to affect engagement with said cam means during rotation of said tuning control.

2. A tuning device for an electrical unit comprising adjustable cam means for altering the tuning of said unit, a rotatably mounted tuning shaft, a gear attached to said shaft intermediate the end portions thereof, mounting means for pivotally supporting said shaft at one of said end portions, biasing means for suspending said shaft at the opposite one of said end portions for normally maintaining said gear in spaced relationship with said adjustable cam means, and lever means frictionally mounted upon said tuning shaft for pivoting said shaft and imparting movement to said gear to affect engagement with said cam means during rotation of said shaft.

3. A tuning device for an electrical unit comprising adjustable tuning screws having gear teeth formed thereon for altering the tuning of said unit, a rotatably mounted tuning shaft, a beveled gear attached to said shaft intermediate the end portions thereof, mounting means for pivotally supporting said shaft at one of said end portions, a spring for suspending said shaft at the opposite one of said end portions for normally maintaining said beveled gear in spaced relationship with said adjustable tuning screws, and a rocker plate mounted upon said shaft for pivoting said shaft and imparting movement to said beveled gear to affect engagement with said tuning screw gear teeth during rotation of said tuning shaft.

4. A tuning device for an electrical unit comprising adjustable tuning screws having gear teeth formed thereon for altering the tuning of said unit, a rotatably mounted tuning shaft, a beveled gear attached to said shaft intermediate the end portions thereof, mounting means for pivotally supporting said shaft at one of said end portions, a yoke formed to provide a stop bracket disposed at the opposite one of said end portions, a spring for suspending said shaft attached to said yoke to normally maintain said beveled gear in spaced relationship with said adjustable tuning screws, and a spring loaded rocker plate frictionally mounted upon said shaft formed to abut said stop bracket to pivot said shaft and impart movement to said beveled gear to affect engagement with said tuning screw gears during rotation of said tuning shaft.

5. A tuning device for an electrical unit comprising a rotatable coarse tuning shaft, a disc mounted upon said coarse tuning shaft, a plurality of spaced tuning screws disposed upon the periphery of said disc providing fine tuning of said device, a rotatably mounted fine tuning shaft spaced from said coarse tuning shaft, a gear mounted upon said fine tuning shaft intermediate the end portions thereof, mounting means for pivotally supporting said fine tuning control shaft at one of said end portions, biasing means for suspending said fine tuning control shaft at the opposite one of said end portions for normally maintaining said gear in spaced relationship with said tuning screws, and lever means frictionally mounted upon said fine tuning control shaft for imparting movement to said gear to affect engagement with one of said tuning screws during rotation of said fine tuning control shaft.

6. A tuning device for an electrical unit comprising a rotatable coarse tuning shaft, a disc mounted upon said coarse tuning shaft, a plurality of spaced reversibly rotatable tuning screws disposed upon the periphery of said disc, means for driving said screws to provide fine tuning of said device, said screws each having a groove formed by a top and bottom land and having a head formed with a lateral wall larger in diameter than the bottom land, said top land terminating in a tail spaced from said screw head wall, and a spring mounted upon said disc adjacent each screw disposed to normally track in the groove when said screws are driven whereby said screw abuts said wall and is prevented from disengaging said spring when rotated in one direction and for engaging said tail to cause tracking in the groove when rotated in the opposite direction.

7. A tuning device for an electrical unit comprising a rotatable coarse tuning shaft, a disc attached to said coarse tuning shaft, fine tuning means including a plurality of fine tuning screws mounted in spaced relationship upon said disc for sequential movement through a given tuning location during rotation of the coarse tuning shaft, a rotatably mounted fine tuning shaft having an operator control coupled thereto, driver means having peripheral engagement means coupled to said fine tuning shaft for rotation during fine tuning shaft rotation, mounting means for normally supporting said driver means in an axially displaced and spaced relationship with said given tuning location whereby the coarse tuning shaft may be rotated without causing engagement between said driver means and said fine tuning means, and means for controlling movement of said driver means to effect peripheral engagement thereof with the fine tuning means at said given location to provide tuning of said unit during manipulation of said fine tuning operator control.

8. A tuning device for an electrical unit comprising a rotatable coarse tuning shaft, a disc attached to said coarse tuning shaft, fine tuning means including a plurality of fine tuning screws each having peripheral gear teeth formed thereon mounted in spaced relationship upon said disc for sequential movement through a given tuning location during rotation of the coarse tuning shaft, a rotatably mounted fine tuning shaft having an operator control coupled thereto, driver means having peripheral gear teeth coupled to said fine tuning shaft for rotation during fine tuning shaft rotation, mounting means for normally supporting said driver means in an axially displaced and spaced relationship with said given tuning location whereby the coarse tuning shaft may be rotated without causing engagement between said driver means and said fine tuning means, and means for controlling movement of said driver means to effect peripheral engagement thereof with the fine tuning means to provide tuning of said unit during rotation of said fine tuning operator control.

9. A tuning device for an electrical unit comprising a rotatable coarse tuning shaft, a disc attached to said coarse tuning shaft, fine tuning means including a plurality of fine tuning screws each having peripheral gear teeth formed thereon mounted in spaced relationship upon said disc for sequential movement through a given longitudinal axial screw position during rotation of the coarse tuning shaft, a rotatably mounted fine tuning shaft having an operator control coupled thereto, driver means having peripheral gear teeth formed to laterally mesh with said screw gear teeth coupled to said fine tuning shaft for rotation during fine tuning shaft rotation, spring mounting means for normally supporting said driver means gear in a laterally displaced and spaced relationship with said given screw axial position whereby the coarse tuning shaft may be rotated without causing engagement between said driver means gear and said fine tuning screw gears, and means for controlling lateral movement of said driver means gear to effect engagement thereof with the fine tuning screw gear located at said given position to provide tuning of said unit during rotation of said fine tuning operator control.

(References on following page)

References Cited in the file of this patent

UNITED STATES PATENTS

| | | |
|---|---|---|
| 2,901,615 | Davendorf | Aug. 25, 1959 |
| 2,942,108 | Goldstein et al. | June 21, 1960 |

FOREIGN PATENTS

| | | |
|---|---|---|
| 684,041 | Great Britain | Dec. 10, 1952 |